United States Patent
Hiraoka et al.

(10) Patent No.: US 10,283,726 B2
(45) Date of Patent: May 7, 2019

(54) ELECTRICITY-GENERATING LAYER OF SOLAR CELL, METHOD FOR PRODUCING SAME, AND SOLAR CELL

(71) Applicants: HITACHI ZOSEN CORPORATION, Suminoe-ku, Osaka-shi, Osaka (JP); KYOTO UNIVERSITY, Sakyo-ku, Kyoto-shi, Kyoto (JP)

(72) Inventors: Kazushi Hiraoka, Osaka (JP); Kazunari Matsuda, Uji (JP); Yuhei Miyauchi, Uji (JP); Shinichirou Mouri, Uji (JP)

(73) Assignees: KYOTO UNIVERSITY, Sakyo-ku, Kyoto-shi (JP); HITACHI ZOSEN CORPORATION, Suminoe-ku, Osaka-shi (JP)

( * ) Notice: Subject to any disclaimer, the term of this patent is extended or adjusted under 35 U.S.C. 154(b) by 534 days.

(21) Appl. No.: 14/424,471

(22) PCT Filed: Aug. 27, 2013

(86) PCT No.: PCT/JP2013/072800
§ 371 (c)(1),
(2) Date: Feb. 27, 2015

(87) PCT Pub. No.: WO2014/034631
PCT Pub. Date: Mar. 6, 2014

(65) Prior Publication Data
US 2015/0207089 A1    Jul. 23, 2015

(30) Foreign Application Priority Data
Aug. 30, 2012    (JP) .................... 2012-189339

(51) Int. Cl.
H01L 51/42    (2006.01)
H01L 51/00    (2006.01)
(Continued)

(52) U.S. Cl.
CPC .......... *H01L 51/4293* (2013.01); *B82Y 10/00* (2013.01); *H01L 51/002* (2013.01);
(Continued)

(58) Field of Classification Search
CPC ............. H01L 51/0045; H01L 51/0046; H01L 51/0048; H01L 51/0049; H01L 51/0575
See application file for complete search history.

(56) References Cited

U.S. PATENT DOCUMENTS

| 6,890,780 B2 * | 5/2005 | Lee .................. B82Y 10/00 257/79 |
| 2003/0122133 A1 * | 7/2003 | Choi ................ B82Y 10/00 257/77 |

(Continued)

FOREIGN PATENT DOCUMENTS

| CN | 101689689 A | 3/2010 | ........... H01M 14/00 |
| CN | 101743662 A | 6/2010 | ........... H01M 14/00 |

(Continued)

OTHER PUBLICATIONS

Li, Y.F., et al.; Formation of p-n junctions in Double-Walled Carbon Nanotubes by a Plasma Ion-irradiation Method; 2008 8th IEEE Conference on Nanotechnology, Arlington, Texas, 2008, pp. 243-246. doi: 10.1109/NANO.2008.79.*

(Continued)

*Primary Examiner* — Edward J. Schmiedel
(74) *Attorney, Agent, or Firm* — Kusner & Jaffe

(57) ABSTRACT

An electricity-generating layer of a solar cell includes a carbon nanotube group containing vertically oriented carbon nanotubes. A fullerene is encapsulated in the carbon nanotube, an n-type dopant 113 is encapsulated between the fullerene and one end of the carbon nanotube, and a p-type dopant is encapsulated between the fullerene and the other end of the carbon nanotube.

2 Claims, 6 Drawing Sheets

(51) Int. Cl.
  *B82Y 10/00* (2011.01)
  *B82Y 30/00* (2011.01)
  *B82Y 40/00* (2011.01)
(52) U.S. Cl.
  CPC ...... *H01L 51/0046* (2013.01); *H01L 51/0048* (2013.01); *H01L 51/0049* (2013.01); *H01L 51/42* (2013.01); *B82Y 30/00* (2013.01); *B82Y 40/00* (2013.01); *Y02E 10/549* (2013.01); *Y02P 70/521* (2015.11)

(56) References Cited

U.S. PATENT DOCUMENTS

| | | | |
|---|---|---|---|
| 2005/0077527 A1* | 4/2005 | Lee | B82Y 10/00 257/79 |
| 2005/0250305 A1* | 11/2005 | Al-Rabadi | B82Y 10/00 438/614 |
| 2008/0110486 A1* | 5/2008 | Tsakalakos | B82Y 20/00 136/244 |
| 2008/0276987 A1* | 11/2008 | Flood | H01L 31/03528 136/256 |
| 2010/0132777 A1 | 6/2010 | Inoue et al. | 136/255 |
| 2010/0132786 A1 | 6/2010 | Inoue et al. | 136/256 |
| 2011/0203632 A1* | 8/2011 | Sen | B82Y 10/00 136/244 |
| 2011/0212554 A1 | 9/2011 | Geohegan et al. | 438/24 |
| 2012/0145230 A1 | 6/2012 | Hiraoka et al. | 136/252 |

FOREIGN PATENT DOCUMENTS

| | | | | |
|---|---|---|---|---|
| CN | 102473752 A | 5/2012 | | H01L 31/04 |
| JP | 2002-097010 | 4/2002 | | C01B 31/02 |
| JP | 2010-056478 | 3/2010 | | H01L 51/42 |
| JP | 2010-515227 A | 5/2010 | | B82B 1/00 |
| JP | 2010-267831 A | 11/2010 | | H01L 31/04 |
| JP | 2011-044511 A | 3/2011 | | H01L 31/04 |

OTHER PUBLICATIONS

R. Hatakeyama, et al.; Infrared photovoltaic solar cells based on C60 fullerene encapsulated single-walled carbon nanotubes; Appl. Phys. Lett. 97, 013104 (2010); doi: http://dx.doi.org/10.1063/1.3462313.*

SES Research; Physical properties of Fullerenes; 2010; https://www.sesres.com/physicalproperties.asp.*

Li, Y. F. et al.; Formation of p-n junctions in Double-Walled Carbon Nanotubes by a Plasma Ion-Irradiation Method; 2008 8th IEEE conference on Nanotechnology, Arlington, Texas, 2008, pp. 243-246; DOI: 10.1109/NANO.2008.79 (Year: 2008).*

Electronegativity table of the elements; www.tutor-homework.com; archived date Dec. 4, 2011; http://www.tutor-homework.com/Chemistry_Help/electronegativity_table/electronegativity.html (Year: 2011).*

Geng, H.Z., et al.; Opening and closing of single-wall carbon nanotubes; Chemical Physics letters 399 (2004) pp. 109-113; https://www.sciencedirect.com/science/article/pii/S0009261404015428 (Year: 2004).*

Kato, Toshiaka, et al.; P-N junction with donor and acceptor encapsulated single-walled carbon nanotube; Appl. Phys. Lett. 95, 083109 (2009); doi: 10.1063/1.3207742; https://aip.scitation.org/doi/pdf/10.1063/1.3207742?class=pdf (Year: 2009).*

Li, Zheng, et al.; Intrinsic region length scaling of heavily doped carbon nanotube p-i-n junctions; Nanoscale, 2013,5, 6999-7004; https://pubs.rsc.org/en/Content/ArticleLanding/2013/NR/c3nr01462b#!divAbstract (Year: 2013).*

Office Action received in corresponding Japanese Patent Application No. 2012-189339, dated Jan. 6, 2016.

International Search Report from corresponding International Patent Application No. PCT/JP2013/072800, dated Oct. 8, 2013 (English-language translation provided).

Office Action received in corresponding Chinese Patent Application No. 201380037063.8, dated Jun. 20, 2016.

\* cited by examiner

ELECTRICITY-GENERATING LAYER OF SOLAR CELL, METHOD FOR PRODUCING SAME, AND SOLAR CELL

RELATED APPLICATIONS

This application is a National Stage of International Application No. PCT/JP2013/072800 filed Aug. 27, 2013, which claims the benefit of Japanese Patent Application No. 2012-189339 filed Aug. 30, 2012.

FIELD OF THE INVENTION

The present invention relates to the electricity-generating layer of a solar cell with a carbon nanotube, a method for producing the same, and the solar cell with the electricity-generating layer.

BACKGROUND OF THE INVENTION

Solar cells with p-type and n-type carbon nanotubes have been proposed.

Conventionally, in the manufacture of these carbon nanotubes, carbon nanotubes are grown on the surface of a substrate by, for example, thermal chemical vapor deposition (may be called thermal CVD); meanwhile, the surface is doped with Group III or V elements of the Periodic Table of the Elements. Specifically, the elements are deposited on the surface of a carbon nanotube (For example, see Japanese Patent Laid-Open No. 2011-44511).

SUMMARY OF THE INVENTION

In the conventional solar cells with carbon nanotubes, the p-type and n-type carbon nanotubes are obtained by depositing a p-type dopant and an n-type dopant on the outer surfaces of carbon nanotubes grown on a substrate. Unfortunately, the dopants may be oxidized so as to reduce durability.

An object of the present invention is to provide the electricity-generating layer of a solar cell that can improve durability, a method for producing the same, and the solar cell with the electricity-generating layer.

In order to solve the problem, an electricity-generating layer of a solar cell according to the present invention includes a carbon nanotube group, the carbon nanotube group including vertically oriented carbon nanotubes, the carbon nanotube containing an n-type dopant on one end of the carbon nanotube and a p-type dopant on another end of the carbon nanotube.

According to another electricity-generating layer of a solar cell according to the present invention, the n-type dopant in the electricity-generating layer is an element having lower electronegativity than the carbon nanotube, and the p-type dopant is an element having higher electronegativity than the carbon nanotube.

According to another electricity-generating layer of a solar cell according to the present invention, the carbon nanotube in the electricity-generating layer contains one of an atom and a molecule that has a diameter substantially equal to the inside diameter of the carbon nanotube between the n-type dopant and the p-type dopant encapsulated in the carbon nanotube.

According to another electricity-generating layer of a solar cell according to the present invention, one of the atom and the molecule that has a diameter substantially equal to the inside diameter of the carbon nanotube in each of the electricity-generating layers is a fullerene.

A method for producing the electricity-generating layer of a solar cell according to the present invention,
the method including:
holding the carbon nanotube group including the vertically oriented carbon nanotubes in layers by means of a holding member, and disposing the held laminar carbon nanotube group in a vacuum vessel; and
encapsulating the n-type dopant on the one end of the carbon nanotube and the p-type dopant on the other end of the carbon nanotube by supplying the n-type dopant from a first dopant supply unit provided on the vacuum vessel and the p-type dopant from a second dopant supply unit provided on the vacuum vessel.

The production method further includes encapsulating, in the carbon nanotube, one of the atom and the molecule that has a diameter substantially equal to the inside diameter of the carbon nanotube before the n-type dopant and the p-type dopant are encapsulated.

A solar cell of the present invention includes the electricity-generating layer disposed between one translucent electrode member disposed on the incident side of light and another electrode member disposed on the opposite side from the incident side of light.

Another solar cell according to the present invention includes the electricity-generating layer disposed between a translucent member disposed on the incident side of light and an electrode member disposed on the opposite side from the incident side of light,
the electrode member including a positive electrode and a negative electrode,
wherein the carbon nanotube group constituting the electricity-generating layer has an end, near the electrode member, in contact with one of the positive electrode and the negative electrode that have the same polarity as the end, the solar cell further includes an insulator disposed on the surface of one of the negative electrode and the positive electrode that have the same polarity as an end of the carbon nanotube group near the translucent member, and the end is connected via a conductive member to one of the negative electrode and the positive electrode that have the same polarity as the end.

According to the configurations of the invention, the electricity-generating layer includes the carbon nanotube group, the n-type dopant is encapsulated on the one end of the carbon nanotube, and the p-type dopant is encapsulated on the other end of the carbon nanotube. This configuration prevents oxidation so as to improve durability unlike in the conventional configuration where the dopant is deposited on the outer surface of the carbon nanotube.

Moreover, the atom or the molecule is encapsulated in the carbon nanotube of the electricity-generating layer, the n-type dopant is encapsulated on the one end of the carbon nanotube, and the p-type dopant is encapsulated on the other end of the carbon nanotube. Since the n-type dopant and the p-type dopant are disposed on both sides via the atom or molecule in a completely separated manner, thereby achieving higher electrical efficiency than in a mixed state of the dopants.

DETAILED DESCRIPTION OF THE PREFERRED EMBODIMENTS

An electricity-generating layer of a solar cell, a method for producing the same, and the solar cell with the electricity-generating layer according to embodiments of the present invention will be described below with reference to the accompanying drawings.

First Embodiment

A solar cell according to a first embodiment of the present invention is mainly configured such that an electricity-generating layer including a carbon nanotube group is disposed between one translucent electrode member that receives incoming sunlight and another electrode member disposed on the opposite side, and an n-type dopant and a p-type dopant are encapsulated in carbon nanotubes constituting the electricity-generating layer.

Figure 1:
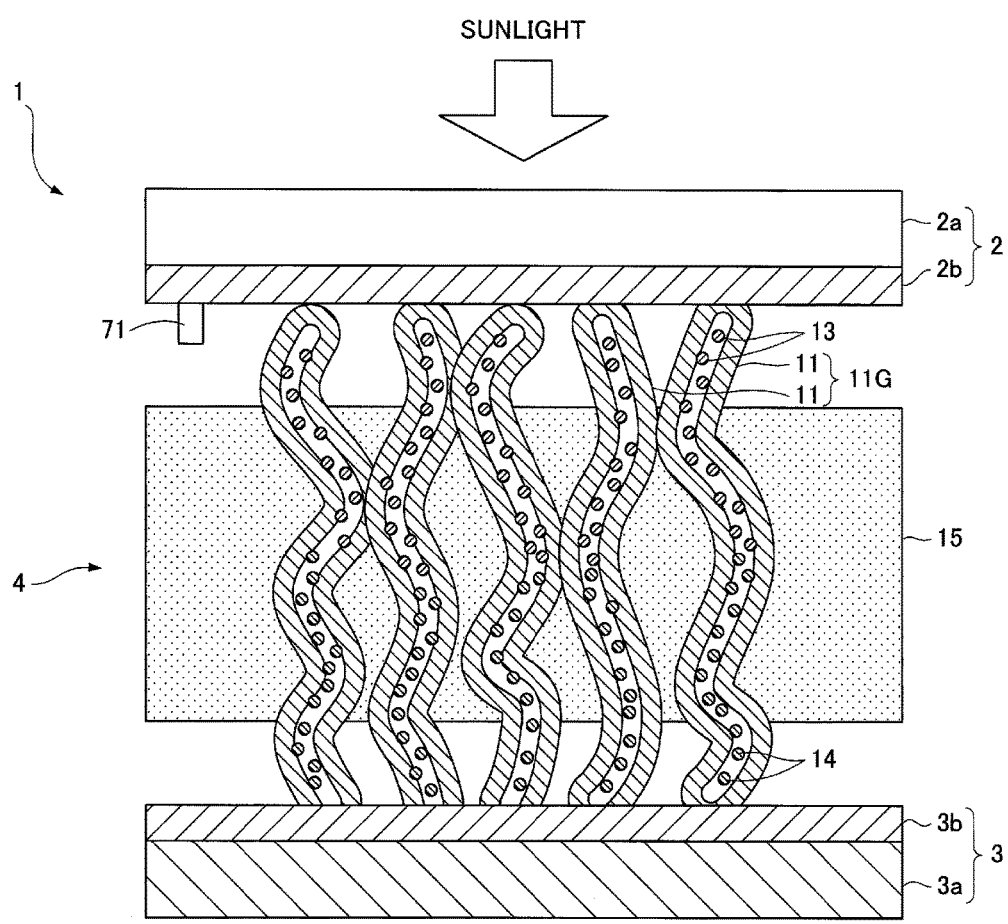
FIG. 1 is a cross-sectional view schematically showing the configuration of a solar cell according to a first embodiment of the present invention.

As shown in FIG. 1, a solar cell 1 includes a translucent electrode (an example of one electrode member) 2 disposed on the incident side of sunlight, a metallic electrode (an example of the other electrode member) 3 disposed on the opposite side from the incident side of sunlight, and an electricity-generating layer 4 that is disposed between the translucent electrode 2 and the metallic electrode 3 and includes a carbon nanotube group containing a plurality of vertically oriented carbon nanotubes.

The translucent electrode 2 includes a transparent substrate (made of materials such as $SiO_2$ and glass) 2a serving as a window member and a transparent conductive film 2b made of ITO or the like on the surface of the transparent substrate 2a. The translucent electrode 2 is a negative electrode.

The metallic electrode 3 includes a metallic plate 3a that is made of, for example, one of Ag, Al, Au, Cu, and Pd and a metallic carbon nanotube 3b formed on the surface of the metallic plate 3a. The metallic electrode 3 is a positive electrode.

As has been discussed, the electricity-generating layer 4 includes the carbon nanotube group, which will be specifically described below.

In the electricity-generating layer 4, carbon nanotubes 11 constituting a carbon nanotube group 11G are single-layer carbon nanotubes (SWCNT: single-wall carbon nanotubes) that are vertically oriented. The carbon nanotube 11 contains an n-type dopant 13 disposed near the translucent electrode 2 and a p-type dopant 14 disposed near the metallic electrode 3. In other words, the n-type dopant 13 and the p-type dopant 14 are encapsulated in the carbon nanotube 11.

The n-type dopant 13 is made of a metal having lower electronegativity than the carbon nanotube 11, for example, one of Ba, Ca, Cs, Fr, K, Li, Mg, Na, Rb, and Sr.

The p-type dopant 14 is an element having higher electronegativity than the carbon nanotube 11, for example, one of Cl, F, N, and O.

Figure 2:
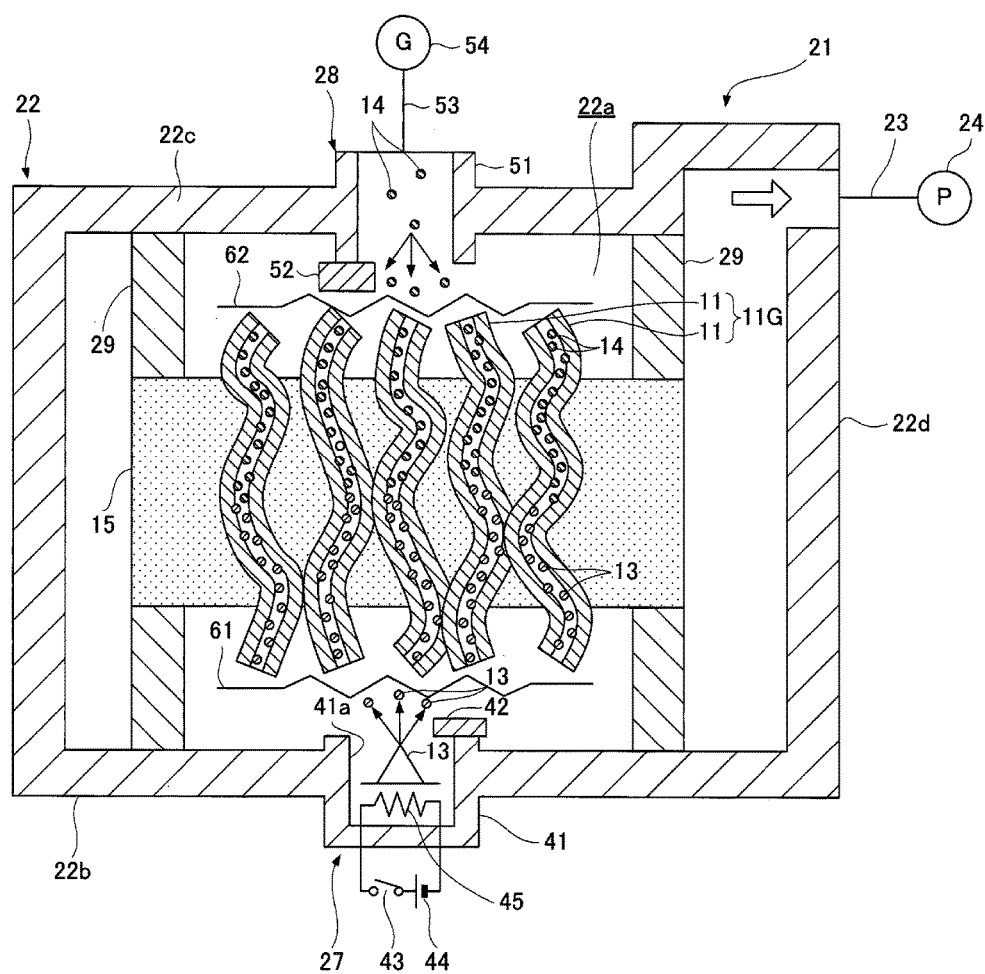
FIG. 2 is a cross-sectional view schematically showing an evaporator that produces an electricity-generating layer in the solar cell according to the first embodiment.

Referring to FIG. 2, a method for producing the electricity-generating layer 4 will be described below.

First, an evaporator used for producing the electricity-generating layer 4 will be briefly described below.

That is, as shown in FIG. 2, an evaporator 21 includes a vacuum vessel 22 having a vacuum chamber 22a accommodating the carbon nanotube group 11G, a vacuum pump 24 that sucks gas from the inside of the vacuum vessel 22 through a suction pipe 23, a first dopant supply unit (may be called an evaporation unit) 27 that is provided on a bottom wall (lower part) 22b of the vacuum vessel 22 so as to supply the n-type dopant 13, and a second dopant supply unit 28 that is provided on a top wall (upper part) 22c of the vacuum vessel 22 so as to supply the p-type dopant 14 to the vacuum chamber 22a.

The first dopant supply unit 27 includes a vessel part 41 that has a top opening 41a and an open/close lid (may be called a shutter) 42 capable of opening and closing the opening 41a, and a heater 45 as a heating device that is disposed in the lower part of the interior of the vessel part 41 and is connected to a power supply 44 via a switch 43.

Thus, the material of the n-type dopant 13 is supplied into the vessel part 41 and then the interior of the vessel part 41 is heated by the heater 45. This can evaporate and move the n-type dopant 13 into the carbon nanotube 11 at a molecular level.

The second dopant supply unit 28 includes a cylindrical entrance part 51 provided on the top wall 22c of the vacuum vessel 22 and an open/close lid (may be called a shutter) 52 provided on the inner end opening of the entrance part 51. The outer end of the entrance part 51 is connected to a gas supply source (e.g., a gas cylinder) 54 of the p-type dopant via a dopant supply pipe 53.

Hence, when the open/close lid 52 is opened to supply the p-type dopant 14 from the gas supply source 54 through the entrance part 51 and the dopant supply pipe 53, the p-type dopant 14 can be moved into the carbon nanotube 11 at a molecular level.

In other words, the dopants 13 and 14 can be encapsulated in the carbon nanotubes 11.

Moreover, heaters 61 and 62 are disposed at upper and lower positions in the vacuum vessel 22, that is, directly above the first dopant supply unit 27 and directly below the second dopant supply unit 28.

The heaters 61 and 62 heat the overall carbon nanotube group 11G serving as the electricity-generating layer 4. Heating to the end of the carbon nanotube group 11G, in particular, can close the opened ends of the carbon nanotubes 11.

A method for producing the solar cell by dopant implantation, particularly, a method for producing the electricity-generating layer will be described below.

As shown in FIG. 1, first, the vertically oriented sheet-like carbon nanotube group 11G is filled with a transparent filler such as water glass acting as a holding member 15, and then the carbon nanotube group 11G is kept (maintained) in a laminar state with a predetermined thickness.

Subsequently, the holding member 15 of the carbon nanotube group 11G is dissolved with a solvent (e.g., fluorinated acid) to expose the ends of the carbon nanotubes 11, and then the ends of the carbon nanotubes 11 are opened with a strong acid (e.g., nitric acid).

After that, the laminar carbon nanotube group 11G is kept at an intermediate position via, for example, a heat insulator 29 in the vacuum vessel 22. Specifically, the holding member 15 is held by the heat insulator 29 via a screw mechanism or the like.

Subsequently, the vacuum chamber 22a is subjected to roughing by driving the vacuum pump 24, inert gas (e.g., argon gas) is substituted in the vacuum chamber 22a, and then the vacuum chamber 22a is evacuated to a predetermined degree of vacuum, e.g., about 0.001 Pa or lower.

When the degree of vacuum reaches a sufficient value, the heater 45 provided in the vessel part 41 of the first dopant supply unit 27 is started to heat the n-type dopant 13 in the vessel part 41 to at least a sublimation temperature. At the start of sublimation of the n-type dopant 13, the open/close lid 42 of the vessel part 41 is opened; meanwhile, the open/close lid 52 of the entrance part 51 is also opened in the dopant supply unit 28.

Hence, as shown in FIG. 2, the n-type dopant 13 rises in the vacuum chamber 22a, moves into (enters) the carbon nanotubes 11 from the lower end openings of the carbon nanotubes 11, and then stays in the carbon nanotubes 11 in a stable state; meanwhile, the p-type dopant 14 is guided into the vacuum chamber 22a from above, moves into the carbon nanotubes 11 from the upper end openings of the carbon nanotubes 11, and then is stabilized therein.

At this point, the carbon nanotube group 11G is heated to a predetermined temperature, for example, about 300° C. by the heaters 61 and 62 disposed on the top and bottom of the carbon nanotube group 11G.

Thus, the p-type dopant 14 is embedded at the upper positions of the carbon nanotubes 11 while the n-type dopant 13 is embedded at the lower positions of the carbon nanotubes 11.

In order to evenly encapsulate the n-type dopant 13 and the p-type dopant 14 in the carbon nanotubes 11, the temperature of the n-type dopant 13 and the supply pressure of the p-type dopant 14 are controlled so as to equalize the steam pressures of the n-type dopant 13 and the p-type dopant 14.

When the dopants 13 and 14 seem to be encapsulated in all the carbon nanotubes 11 (e.g., after about ten hours), the heater 45 of the vessel part 41 is stopped and the open/close lid 42 is closed. The open/close lid 52 of the entrance part 51 is also closed.

Finally, the ends of the carbon nanotubes 11 are locally heated by the heaters 61 and 62 disposed above and below the carbon nanotube group 11G, thereby closing the opened ends of the carbon nanotubes 11. The stably encapsulated dopant in the carbon nanotubes 11 does not need to be closed.

When the solar cell 1 is produced using the obtained electricity-generating layer 4, as shown in FIG. 1, the metallic electrode 3 is bonded to the laminar carbon nanotube group 11G, which includes the vertically oriented carbon nanotubes 11, near the encapsulated p-type dopant 14. The metallic electrode 3 is formed by applying the paste of the metallic carbon nanotube (MWCNT: multi-wall carbon nanotube) 3b to the metallic plate 3a made of one of Al, Ag, Au, Pd, and Cu. Moreover, the translucent electrode 2 including the transparent conductive film 2b formed on the surface of the transparent substrate 2a is bonded to the carbon nanotube group 11G near the encapsulated n-type dopant 13. An auxiliary electrode 71 is provided on the surface of the translucent electrode 2. The translucent electrode may be a metallic electrode shaped like a comb or a mesh.

The electricity-generating layer 4 includes the carbon nanotube group in which the n-type dopant is encapsulated on one end of the carbon nanotube 11 while the p-type dopant is encapsulated on the other end of the carbon nanotube 11. This configuration prevents oxidation so as to improve durability unlike in the conventional configuration where the dopant is deposited on the outer surface of the carbon nanotube.

Second Embodiment

A solar cell according to a second embodiment of the present invention is mainly configured such that an electricity-generating layer including a carbon nanotube group is disposed between one translucent electrode member that receives incoming sunlight and another electrode member disposed on the opposite side, a fullerene is encapsulated at the center of the carbon nanotube, and an n-type dopant is encapsulated between the fullerene and one end of the carbon nanotube while a p-type dopant is encapsulated between the fullerene and the other end of the carbon nanotube.

Figure 3:
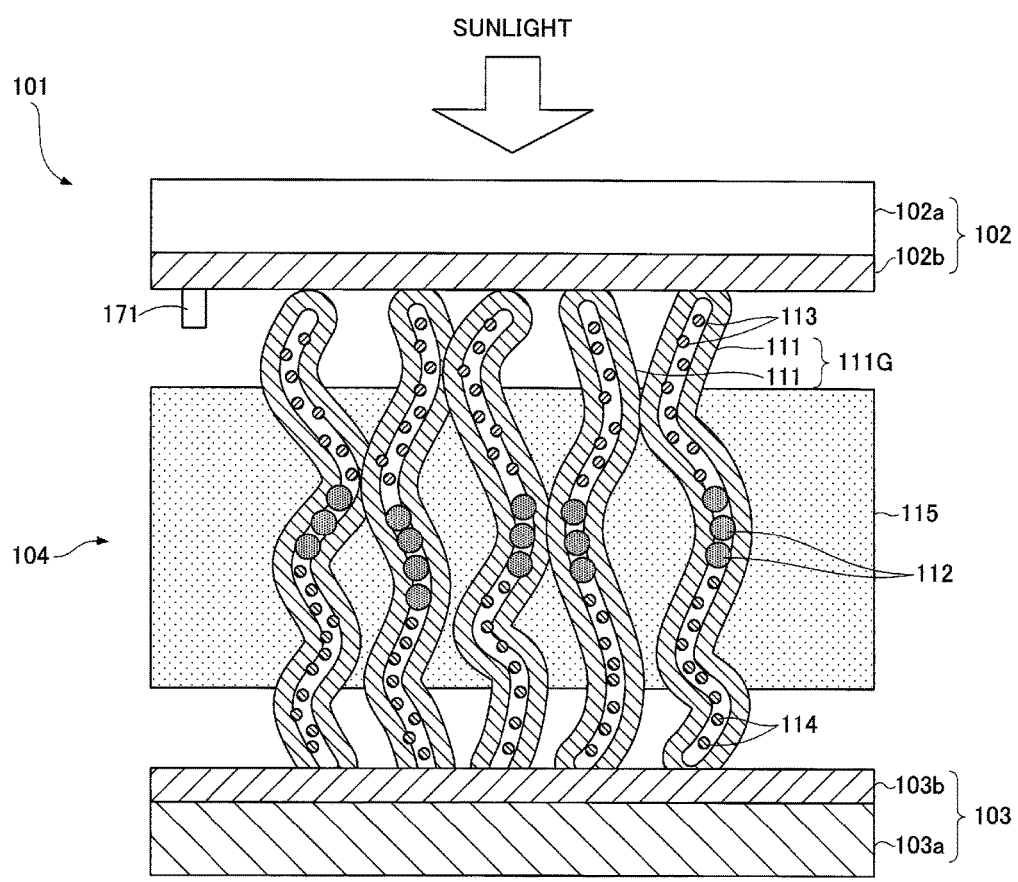
FIG. 3 is a cross-sectional view schematically showing the configuration of a solar cell according to a second embodiment of the present invention.

As shown in FIG. 3, a solar cell 101 includes a translucent electrode (an example of one electrode member) 102 disposed on the incident side of sunlight, a metallic electrode (an example of the other electrode member) 103 disposed on the opposite side from the incident side of sunlight, and an electricity-generating layer 104 that is disposed between the translucent electrode 102 and the metallic electrode 103 and includes a carbon nanotube group containing a plurality of vertically oriented carbon nanotubes.

The translucent electrode 102 includes a transparent substrate (made of materials such as $SiO_2$ and glass) 102a serving as a window member and a transparent conductive film 102b made of ITO or the like on the surface of the transparent substrate 102a. The translucent electrode 102 is a negative electrode.

The metallic electrode 103 includes a metallic plate 103a that is made of, for example, one of Ag, Al, Au, Cu, and Pd and a metallic carbon nanotube 103b formed on the surface of the metallic plate 103a. The metallic electrode 103 is a positive electrode.

As has been discussed, the electricity-generating layer 104 includes the carbon nanotube group, which will be specifically described below.

In the electricity-generating layer 104, carbon nanotubes 111 constituting a carbon nanotube group 111G are single-layer carbon nanotubes (SWCNT: single-wall carbon nanotubes) that are vertically oriented. The carbon nanotube 111 contains, for example, a fullerene 112 disposed at the center (preferably near the center) of the interior of the carbon nanotube as an atom or a molecule having a slightly smaller outside diameter than the inside diameter of the carbon nanotube. Moreover, an n-type dopant 113 is disposed between the translucent electrode 102 and the fullerene 112 in the carbon nanotube 111 while a p-type dopant 114 is disposed between the metallic electrode 103 and the fullerene 112. The fullerene 112 disposed at the center forms an i-type portion (intrinsic semiconductor).

In other words, the n-type dopant 113, the fullerene 112, and the p-type dopant 114 are sequentially encapsulated in the carbon nanotube 111, that is, a pin junction (p-type portion, i-type portion, n-type portion) is formed in the carbon nanotube 111.

The n-type dopant 113 is made of a metal having lower electronegativity than the carbon nanotube 111, for example, one of Ba, Ca, Cs, Fr, K, Li, Mg, Na, Rb, and Sr.

The p-type dopant 114 is an element having higher electronegativity than the carbon nanotube 111, for example, one of Cl, F, N, and O.

The fullerene 112 is made of C20 or C60. As a matter of course, the fullerene is sized so as to be movable in the carbon nanotube 111 (with an outside diameter slightly smaller than the inside diameter of the carbon nanotube). In order to prevent a movement of the dopants 113 and 114, the selected fullerene has a maximum size. For example, for a carbon nanotube having a diameter of 1 nm or less, a fullerene C20 is selected. For a carbon nanotube having a diameter larger than 1 nm but not larger than 2 nm, a fullerene C60 is selected. For example, if the carbon nanotube has an outside diameter of 0.8 nm to 2 nm, the fullerene 112 is replaced with nanoparticles of Au, Pt, and so on (with an outside diameter of about 0.5 nm to 1.8 nm). If the carbon nanotube has an outside diameter of 0.4 nm to 0.82 nm, the fullerene 112 is replaced with a Xe atom having an outside diameter of 0.22 nm. As a matter of course, atoms or molecules other than the fullerene are selected such that an i-type portion in a carbon nanotube is encapsulated.

Figure 4:
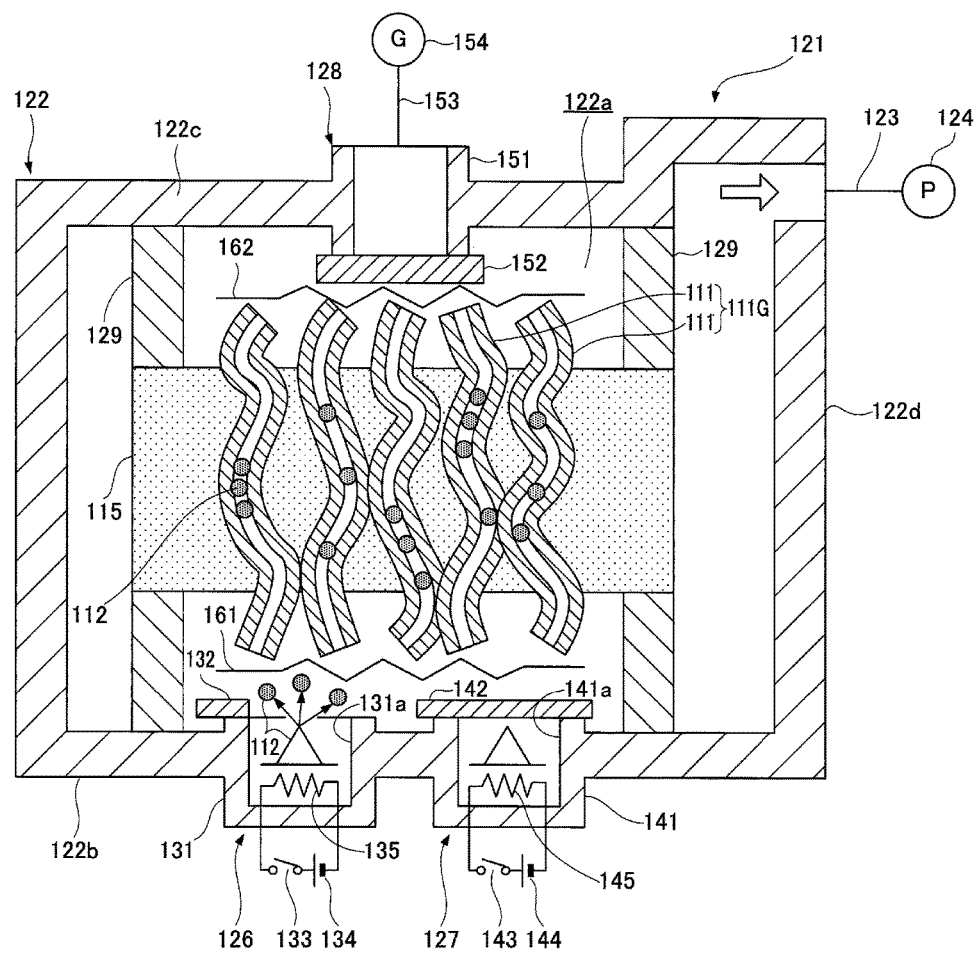
FIG. 4 is a cross-sectional view schematically showing an evaporator that produces an electricity-generating layer in the solar cell according to the second embodiment.
Figure 5:
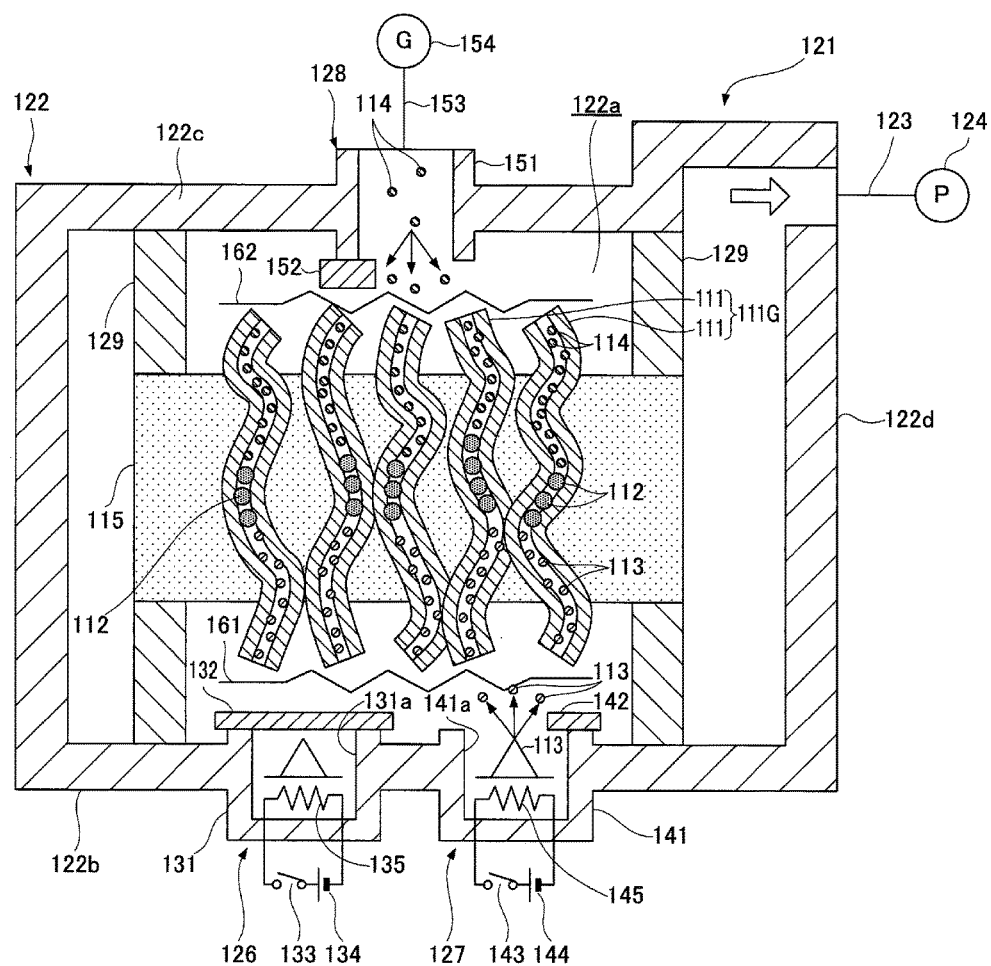
FIG. 5 is a cross-sectional view schematically showing a device for illustration of a method for producing the electricity-generating layer of the solar cell according to the second embodiment.

Referring to FIGS. 4 and 5, a method for producing the electricity-generating layer 104 will be described below.

First, an evaporator used for producing the electricity-generating layer 104 will be briefly described below.

That is, as shown in FIG. 4, an evaporator 121 includes a vacuum vessel 122 having a vacuum chamber 122a accommodating the carbon nanotube group 111G, a vacuum pump 124 that sucks gas from the inside of the vacuum vessel 122 through a suction pipe 123, a fullerene supply unit (may be called an evaporation unit) 126 that is provided on a bottom wall (lower part) 122b of the vacuum vessel 122 so as to supply the fullerene 112, a first dopant supply unit 127 that supplies the n-type dopant 113, and a second dopant supply unit 128 that is provided on a top wall (upper part) 122c of the vacuum vessel 122 so as to supply the p-type dopant 114 to the vacuum chamber 122a.

The fullerene supply unit 126 includes a vessel part 131 that has a top opening 131a and an open/close lid (may be called a shutter) 132 capable of opening and closing the opening 131a, and a heater 135 as a heating device that is disposed in the lower part of the interior of the vessel part 131 and is connected to a power supply 134 via a switch 133.

Thus, the fullerene 112 is supplied into the vessel part 131 and then the interior of the vessel part 131 is heated by the heater 135. This can sublimate and move the fullerene 112 into the carbon nanotube 111 at a molecular level.

The first dopant supply unit 127 includes a vessel part 141 that has a top opening 141a and an open/close lid (may be called a shutter) 142 capable of opening and closing the opening 141a, and a heater 145 as a heating device that is disposed in the lower part of the interior of the vessel part 141 and is connected to a power supply 144 via a switch 143.

Thus, as shown in FIG. 5, the material of the n-type dopant 113 is supplied into the vessel part 141 and then the interior of the vessel part 141 is heated by the heater 145. This can evaporate and move the n-type dopant 113 into the carbon nanotube 111 at a molecular level.

The second dopant supply unit 128 includes a cylindrical entrance part 151 provided on the top wall 122c of the vacuum vessel 122 and an open/close lid (may be called a shutter) 152 provided on the inner end opening of the entrance part 151. The outer end of the entrance part 151 is connected to a gas supply source (e.g., a gas cylinder) 154 of the p-type dopant via a dopant supply pipe 153.

Hence, when the open/close lid 152 is opened to supply the p-type dopant 114 from the gas supply source 154 through the entrance part 151 and the dopant supply pipe 153, the p-type dopant 114 can be moved into the carbon nanotube 111 at a molecular level.

In other words, the fullerene 112 and the dopants 113 and 114 can be encapsulated in the carbon nanotubes 111.

Moreover, heaters 161 and 162 are disposed at upper and lower positions in the vacuum vessel 122, that is, directly above the fullerene supply unit 126 and the first dopant supply unit 127 and directly below the second dopant supply unit 128, respectively.

The heaters 161 and 162 heat the overall carbon nanotube group 111G serving as the electricity-generating layer 104. Heating to the end of the carbon nanotube group 111G, in particular, can close the opened ends of the carbon nanotubes 111.

A method for producing the solar cell by dopant implantation, particularly, a method for producing the electricity-generating layer will be described below.

As shown in FIG. 3, first, the vertically oriented sheet-like carbon nanotube group 111G is filled with a transparent filler such as water glass acting as a holding member 115, and then the carbon nanotube group 111G is kept (maintained) in a laminar state with a predetermined thickness.

Subsequently, the holding member 115 of the carbon nanotube group 111G is dissolved with a solvent (e.g., fluorinated acid) to expose the ends of the carbon nanotubes 111, and then the ends of the carbon nanotubes 111 are opened with a strong acid (e.g., nitric acid).

After that, the laminar carbon nanotube group 111G is kept at an intermediate position via, for example, a heat insulator 129 in the vacuum vessel 122. Specifically, the holding member 115 is held by the heat insulator 129 via a screw mechanism or the like.

Subsequently, the vacuum chamber 122a is subjected to roughing by driving the vacuum pump 124, inert gas (e.g., argon gas) is substituted in the vacuum chamber 122a, and then the vacuum chamber 122a is evacuated to a predetermined degree of vacuum, e.g., about 0.001 Pa or lower.

When the degree of vacuum reaches a sufficient value, the heater 135 provided in the vessel part 131 of the fullerene supply unit 126 is started to heat the vessel part 131 to 500° C. Since the fullerene 112 sublimates at 500° C., the open/close lid 132 is opened to supply the fullerene 112 into the vacuum chamber 122a.

At this point, the carbon nanotube group 111G is heated to a predetermined temperature, e.g., about 300° C. by the heaters 161 and 162 disposed above and below the carbon nanotube group 111G.

The supply state of the fullerene 112 is kept until at least one of the fullerenes 112 emitted from the vessel part 131 seems to move into the carbon nanotube 111 held in the vacuum vessel 122 (e.g., after about five hours).

When the fullerene 112 seems to be encapsulated in the carbon nanotube group 111G, the heater 135 of the vessel part 131 is turned off and the open/close lid 132 is closed.

Subsequently, after it is confirmed again that the degree of vacuum in the vacuum chamber 122a is not higher than the predetermined value (if the degree of vacuum is higher than the predetermined value, needless to say, the vacuum chamber 122a is evacuated), the heater 145 provided in the vessel part 141 of the first dopant supply unit 127 is started to heat the n-type dopant 113 in the vessel part 141 to at least a sublimation temperature. At the start of sublimation of the n-type dopant 113, the open/close lid 142 of the vessel part 141 is opened; meanwhile, the open/close lid 152 of the entrance part 151 is also opened in the dopant supply unit 128.

Hence, as shown in FIG. 5, the n-type dopant 113 rises in the vacuum chamber 122a, moves into (enters) the carbon nanotubes 111 from the lower end openings of the carbon nanotubes 111, and then stays in the carbon nanotubes 111 in a stable state; meanwhile, the p-type dopant 114 is guided into the vacuum chamber 122a from above, moves into the carbon nanotubes 111 from the upper end openings of the carbon nanotubes 111, and then is stabilized therein.

Thus, in the carbon nanotube 111, the p-type dopant 114 is embedded above the fullerene 112 at an intermediate position and the n-type dopant 113 is embedded below the fullerene 112.

In order to evenly encapsulate the n-type dopant 113 and the p-type dopant 114 in the carbon nanotubes 111, the temperature of the n-type dopant 113 and the supply pressure of the p-type dopant 114 are respectively controlled so as to equalize the steam pressures of the n-type dopant 113 and the p-type dopant 114.

When the dopants 113 and 114 seem to be encapsulated in all the carbon nanotubes 111 (e.g., after about ten hours), the heater 145 of the vessel part 141 is stopped and the open/close lid 142 is closed. The open/close lid 152 of the entrance part 151 is also closed.

Finally, the ends of the carbon nanotubes 111 are locally heated by the heaters 161 and 162 disposed above and below the carbon nanotube group 111G, thereby closing the opened ends of the carbon nanotubes 111. The stably encapsulated dopant in the carbon nanotube 111 does not need to be closed.

When the solar cell 101 is produced using the obtained electricity-generating layer 104, as shown in FIG. 3, the metallic electrode 103 is bonded to the laminar carbon nanotube group 111G, which includes the vertically oriented carbon nanotubes 111, near the encapsulated p-type dopant 114. The metallic electrode 103 is formed by applying the paste of the metallic carbon nanotube (MWCNT: multi-wall carbon nanotube) 103b to the metallic plate 103a made of one of Al, Ag, Au, Pd, and Cu. Moreover, the translucent electrode 102 including the transparent conductive film 102b formed on the surface of the transparent substrate 102a is bonded to the carbon nanotube group 111G near the encapsulated n-type dopant 113. An auxiliary electrode 171 is provided on the surface of the translucent electrode 102. The translucent electrode may be a metallic electrode shaped like a comb or a mesh.

The electricity-generating layer 104 includes the carbon nanotube group 111G, the fullerene 112 is encapsulated at the intermediate position of the carbon nanotube 111, the n-type dopant 113 is encapsulated between the fullerene 112 and one end of the carbon nanotube 111, and the p-type dopant 114 is encapsulated between the fullerene 112 and the other end of the carbon nanotube 111. This configuration prevents oxidation so as to improve durability unlike in the conventional configuration where the dopant is deposited on the outer surface of the carbon nanotube. Additionally, the n-type dopant and the p-type dopant are disposed on both sides of the fullerene in a completely separated manner, thereby achieving higher electrical efficiency than in a mixed state of the dopants.

Furthermore, the carbon nanotube in the electricity-generating layer has an n-type portion near the metallic electrode and a p-type portion near the translucent electrode, and the fullerene is encapsulated as an i-type portion at an intermediate position between the portions. This configuration generates a less steep potential gradient with a wider range than in the case of the carbon nanotube having a pn junction (a pn junction has a steep potential gradient in a narrow range, allowing only the use of light absorbed in the narrow range), that is, sunlight can be absorbed over the wide range, thereby improving the conversion efficiency of sunlight energy.

Third Embodiment

An electricity-generating layer and a solar cell with the electricity-generating layer according to a third embodiment of the present invention will be described below.

In the second embodiment, the translucent electrode is disposed on one surface of the electricity-generating layer while the metallic electrode is disposed the other surface of the electricity-generating layer. In the solar cell of the third embodiment, a translucent member having translucency is disposed on one surface of an electricity-generating layer while an electrode member composed of a positive electrode and a negative electrode is disposed on another surface of the electricity-generating layer. The configuration of a carbon nanotube group in the electricity-generating layer of the third embodiment is identical to that of the second embodiment and thus the detailed explanation thereof is omitted.

Figure 6:
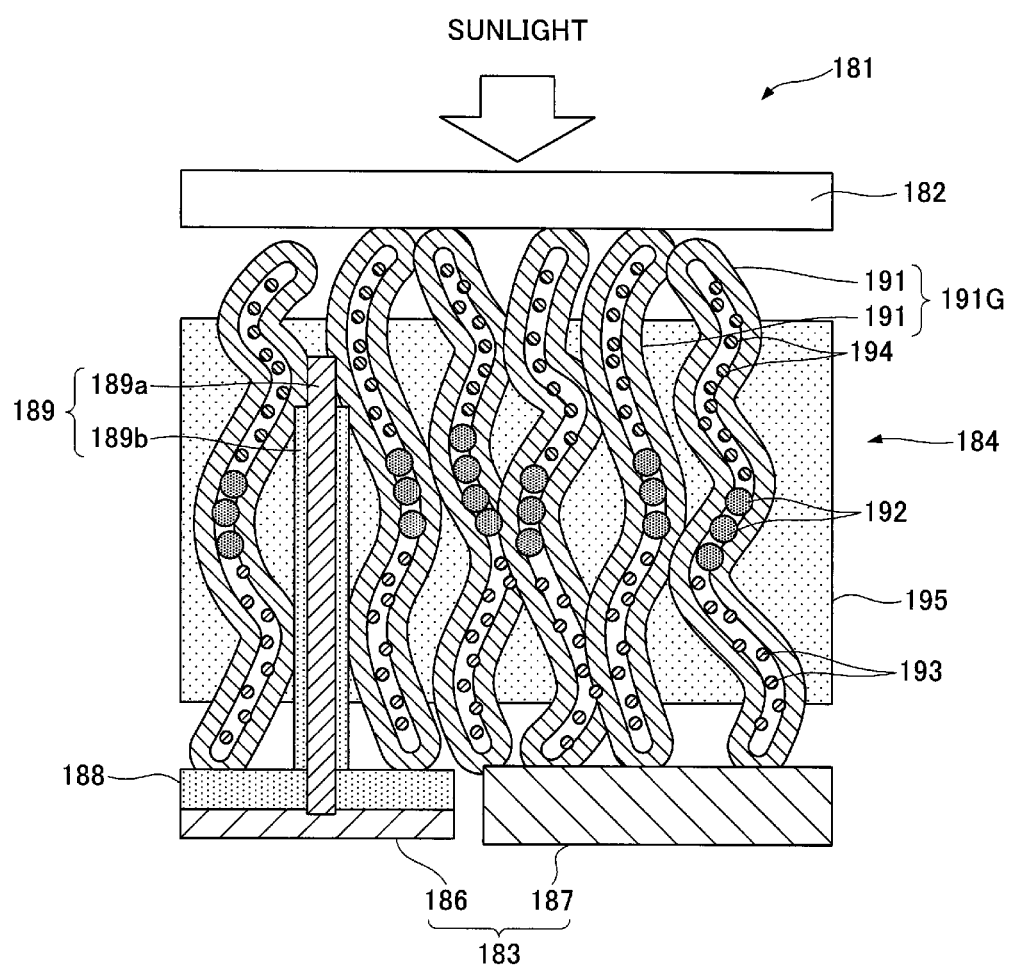
FIG. 6 is a cross-sectional view schematically showing the configuration of a solar cell according to a third embodiment of the present invention.

As shown in FIG. 6, a solar cell 181 according to the third embodiment is mainly configured such that an electricity-generating layer 184 including a carbon nanotube group 191G composed of a plurality of carbon nanotubes 191 is disposed between a translucent member (a transparent substrate made of materials such as $SiO_2$ and glass) 182, which serves as a window member disposed on the incident side of sunlight, and an electrode member 183 disposed on the opposite side from the incident side of sunlight, the electrode member 183 including a positive electrode 186 and a negative electrode 187.

As a matter of course, a fullerene 192 is encapsulated at the center of the carbon nanotube 191. Moreover, an n-type dopant 193 is encapsulated between the fullerene 192 and one end of the carbon nanotube 191 (the opposite side from the incident side of sunlight) while a p-type dopant 194 is encapsulated between the fullerene 192 and another Furthermore, an n-type portion near the electrode member 183, that is, one end of the carbon nanotube group 191G constituting the electricity-generating layer 184 is in contact with the negative electrode 187 having the same polarity as the one end, whereas an insulator 188 is disposed on the surface of the positive electrode 186 having the same polarity as a p-type portion near the translucent member 182, that is, another end of the carbon nanotube group 191G. The p-type portion and the positive electrode 186 are connected to each other via a conductive member 189.

Specifically, in the carbon nanotube group 191G, a portion where the n-type dopant 193 is encapsulated is electrically connected to the negative electrode 187 while a portion where the p-type dopant 194 is encapsulated is electrically connected to the positive electrode 186 via the conductive member 189.

In other words, the negative electrode 187 is in direct contact with the one end of the carbon nanotube group 191G while the positive electrode 186 and the other end of the carbon nanotube group 191G are electrically connected to each other via the conductive member 189 that is inserted with an insulated surface into the n-type portion on the one end of the carbon nanotube group 191G.

The conductive member 189 includes a plurality of conductive metallic pins (may be called electrode pins) 189a that are raised at predetermined intervals on the surface of the positive electrode 186 so as to electrically connect the positive electrode 186 and the p-type portion of the carbon nanotube group 191G, and an insulating film 189b formed on the outer surface of the metallic pin 189a corresponding to the n-type portion of the carbon nanotube group 191G and an i-type portion containing the fullerene 192. As a matter of course, the metallic pin 189a is extended longer than the total thickness of the n-type portion and the i-type portion of the carbon nanotube group 191G. Moreover, the positive electrode 186 and the n-type portion of the carbon nanotube group 191G are electrically insulated from each other by the insulator 188.

A method for producing the electricity-generating layer 184 is substantially identical in principle to that of the second embodiment. The conductive member 189 is stuck (inserted) into the sheet-like carbon nanotube group 191G before the carbon nanotube group 191G is held by a holding member 195.

With this configuration, even if the electrodes 186 and 187 are placed on one surface, the carbon nanotube group 191G has a pin junction region over the electrode member 183, preventing a reduction in electrical efficiency.

According to the configuration of the solar cell 181, the positive electrode 186 and the negative electrode 187, that is, the electrode member 183 is disposed on one surface (back side) of the electricity-generating layer 184. This can eliminate the need for transparent electrodes or comb-shaped electrodes that are necessary in the conventional configuration, achieving lower manufacturing cost in addition to the effect of the second embodiment.

Since transparent electrodes are not necessary, a power loss is reduced accordingly. Moreover, this configuration allows entry of sunlight unlike comb-shaped electrodes, thereby preventing a reduction in electrical efficiency.

The carbon nanotube group 191G constituting the electricity-generating layer 184 according to the third embodiment has the n-type portion near the electrode member 183 and the p-type portion near the translucent member 182. The p-type portion may be provided near the electrode member 183 while the n-type portion may be provided near the translucent member 182.

The configuration of the solar cell according to the third embodiment will be schematically described below.

Specifically, the solar cell includes the electricity-generating layer that is disposed between the translucent member on the incident side of light and the electrode member on the opposite side from the incident side of light, the electrode member including the positive electrode and the negative electrode, wherein the carbon nanotube group constituting the electricity-generating layer has an end, near the electrode member, in contact with one of the positive electrode and the negative electrode that have the same polarity as the end, the solar cell further includes an insulator disposed on the surface of one of the negative electrode and the positive electrode that have the same polarity as an end of the carbon nanotube group near the translucent member, and the end is connected via a conductive member to one of the negative electrode and the positive electrode that have the same polarity as the end.

Having described the invention, the following is claimed:

1. An electricity-generating layer of a solar cell, the electricity-generating layer including a carbon nanotube group, the carbon nanotube group including vertically oriented carbon nanotubes, wherein one of the vertically oriented carbon nanotubes encapsulates an n-type dopant on one end of the one of the vertically oriented carbon nanotubes and a p-type dopant on another end of the one of the vertically oriented carbon nanotubes, wherein the one of the vertically oriented carbon nanotubes encapsulates at least one of an atom or a molecule that has a diameter substantially equal to an inside diameter of the one of the vertically oriented carbon nanotubes, the at least one of the atom or the molecule being between the n-type dopant and the p-type dopant encapsulated in the one of the vertically oriented carbon nanotubes, wherein the at least one of the atom or the molecule that has a diameter substantially equal to the inside diameter of the one of the vertically oriented carbon nanotubes is a fullerene, and wherein the fullerene forms an i-type portion.

2. The electricity-generating layer of a solar cell according to claim 1, wherein the ends of the one of the vertically oriented carbon nanotubes are closed by carbon material.

* * * * *